US012620430B2

(12) United States Patent
Rooney et al.

(10) Patent No.: US 12,620,430 B2
(45) Date of Patent: May 5, 2026

(54) APPARATUSES AND METHODS FOR MONITORED REFRESH MANAGEMENT OPERATIONS

(71) Applicant: Micron Technology, Inc., Boise, ID (US)

(72) Inventors: Randall J. Rooney, Boise, ID (US); Jeremy Chritz, Seattle, WA (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 18/746,618

(22) Filed: Jun. 18, 2024

(65) Prior Publication Data

US 2025/0118350 A1     Apr. 10, 2025

Related U.S. Application Data

(60) Provisional application No. 63/588,789, filed on Oct. 9, 2023.

(51) Int. Cl.
*G11C 11/406*      (2006.01)
(52) U.S. Cl.
CPC .................................. *G11C 11/406* (2013.01)

(58) Field of Classification Search
CPC ........... G11C 11/406; G11C 11/40603; G11C 11/40611; G11C 11/40615; G11C 11/40622
USPC .............................................. 365/222, 230.06
See application file for complete search history.

(56) References Cited

U.S. PATENT DOCUMENTS

2013/0304982 A1*  11/2013  Jung ..................... G11C 11/403
                                                                711/106
2016/0133314 A1*   5/2016  Hwang ............. G11C 11/40611
                                                                365/189.02
2017/0287547 A1*  10/2017  Ito ......................... G11C 29/783
2021/0035625 A1*   2/2021  Okuno ................ G11C 11/4087

* cited by examiner

*Primary Examiner* — Michael T Tran
(74) *Attorney, Agent, or Firm* — Dorsey & Whitney LLP

(57)                    ABSTRACT

A controller performs an access operation on a word line which is in a portion of a memory array in a memory device. The controller counts accesses on a portion-by-portion basis (e.g., a bank-by-bank basis, a sub-bank-by-sub-bank basis, etc.). The memory counts accesses on a word line-by-word line basis. The memory sets a refresh management (RFM) flag for a portion based on the counts associated with the word lines in that portion. The controller checks the RFM flag for a portion based on the access count for the portion. The controller issues an RFM command after checking the RFM flag if the RFM flag is set.

21 Claims, 5 Drawing Sheets

APPARATUSES AND METHODS FOR MONITORED REFRESH MANAGEMENT OPERATIONS

CROSS REFERENCE TO RELATED APPLICATION(S)

This application claims the benefit under 35 U.S.C. § 119 of the earlier filing date of U.S. Provisional Application Ser. No. 63/588,789 filed Oct. 9, 2023 the entire contents of which is hereby incorporated by reference in its entirety for any purpose.

BACKGROUND

Information may be stored on memory cells of a memory device. The memory cells may be organized at the intersection of word lines (rows) and bit lines (columns). Information in the memory cells may decay over time. For example, the information may be stored as a charge on a capacitor which may decay over time. The memory device may perform refresh operations to restore the information and prevent information from being lost.

Certain patterns of access may cause an increased rate of information decay in nearby memory cells (e.g., the memory cells along nearby word lines). Memory devices may use various schemes to identify these access patterns so that additional targeted refresh operations may be performed. A controller may signal the memory to perform refresh operations, some of which may be sequential operations to refresh memory cells decaying at an expected rate and some of which may be targeted refresh operations. However, refresh operations may take up time which could be used for other operations, and may use power. There may be a need to ensure that the controller does not over issue refresh commands.

DETAILED DESCRIPTION

Figure 1:
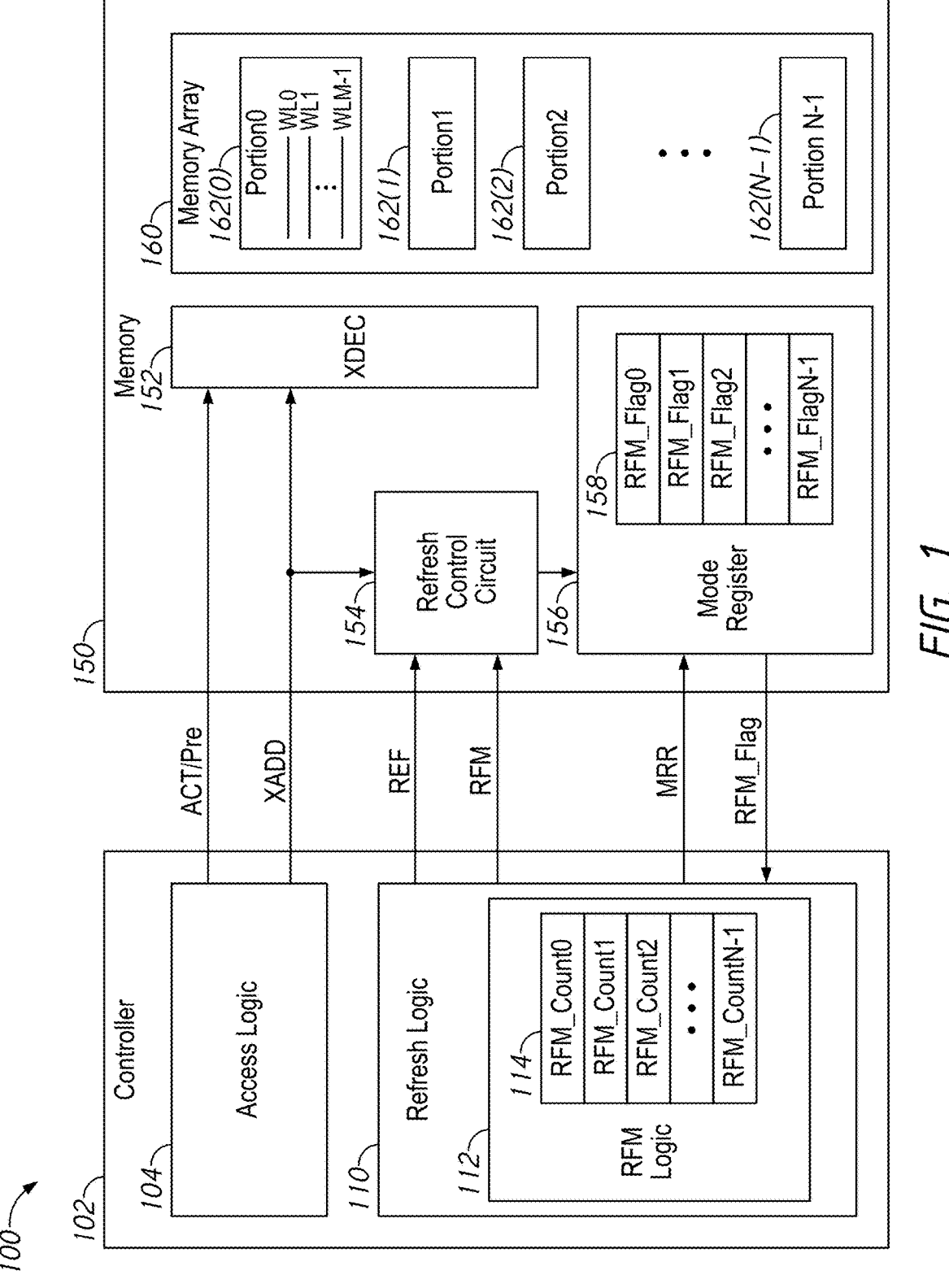
FIG. 1 is a block diagram of a memory system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory array may be accessed by one or more access operations, such as read or write operations. During an example access operation a word line may be activated based on a row address and then selected memory cells along that active word line may have their information read or written to based on which bit lines are accessed, which may be based on a column address. The memory array may be refreshed on a row by row basis (e.g., as part of an auto-refresh and/or self-refresh mode) where the memory cells along each row are refreshed periodically. Such refresh operations may be referred to as sequential refresh operations or normal refresh operations, as the memory may use some sequence logic (e.g., a counter) to generate the refresh addresses. The speed at which the rows are refreshed (e.g., the maximum time any given row will go between refreshes) may be determined based on an expected rate of information decay and may be adjusted based on various conditions of the memory (e.g., temperature).

Various patterns of access to a row (an aggressor row) may cause an increased rate of information decay in nearby memory cells (e.g., along victim rows). For example, a 'row hammer' may involve repeated accesses to the aggressor row which may increase a rate of decay in adjacent rows (and/or in rows which are further away). Accordingly, it may be important to track a number of accesses to each row to determine if they are aggressors, such that the victim rows can be identified and refreshed as part of a targeted refresh operation. For example, each word line may have an associated count value which is used to determine how many times that word line has been accessed.

The memory device may monitor accesses to word lines to determine if they are aggressors or not (e.g., if the number of accesses crosses a threshold). Identified aggressors may be stored in an aggressor queue and their victims refreshed as part of a targeted refresh operation. The memory may perform targeted refresh operations responsive to a refresh management (RFM) command issued by a controller. However, this may be wasteful of both time and power if there is no identified aggressor row. In order to better manage time and power consumption, there may be a need for monitored refresh management (MRFM) operations.

The present disclosure is drawn to apparatuses, systems, and methods for MRFM operations. A memory device may be organized into a number of portions (e.g., banks, groups of banks, sub-banks, etc.), each of which includes a number of word lines each associated with a count value. Each time a word line is accessed, its count value is changed, and compared to an aggressor threshold. If at least one of the count values in a portion crosses the aggressor threshold, an RFM flag is set for that portion. For example, the RFM flag may be set in a mode register of the memory. The controller uses its own logic to determine when to issue an RFM command to the portion. For example, the controller may count access operations performed on each portion, and determine that an RFM should be sent when the count value crosses an RFM threshold. When the controller decides to perform an RFM operation on a portion, it checks the flag associated with that portion. For example, the controller may check the flag by reading a mode register of the memory. If the flag is set, the RFM command is issued to that portion. If the flag is not set, then the RFM command is not sent. This may allow the controller to only send RFM commands when the memory indicates that an RFM command would be useful. This, in turn, may allow for other advantages, such as simplifying the logic the controller uses to determine whether to check to see if an RFM command should be sent or not.

FIG. 1 is a block diagram of a memory system according to some embodiments of the present disclosure. The memory system 100 includes a memory device 150, and a controller 102 which operates the memory device. The controller 102 and memory may, in some embodiments, be integrated components, for example on a single chip. In some embodiments, the controller 102 and memory 150 may be separate components, for example, the controller 102 may be a processor coupled to the memory 150 through a mother board or other intermediary component.

The controller 102 includes an access logic circuit 104 which performs access operations, such as read and write operations, to store data on the memory 150 or retrieve data from the memory 150. The controller 102 also includes a refresh logic circuit 110 which sends a refresh command REF to the memory 150 to have it perform one or more refresh operations. The refresh logic circuit 110 includes an RFM logic circuit 112 which determines when and if the controller should send an RFM command to the memory 150. The memory 150 includes a memory array 160 which is used to store information such as data which is written by and read to the controller 102. A row decoder (XDEC) 152 of the memory 150 accesses word lines (WL) of the memory array 160 responsive to a row address XADD and activate ACT signal. The memory 150 includes a refresh control circuit 154 which generates refresh addresses and provides signals to have the row decoder 152 refresh one or more word lines as part of refresh operations. The refresh control circuit 154 also manages setting RFM flags 158 in a mode register 156 of the memory 152. Each of the RFM flags 158 is associated with a respective portion 162 of the memory array 160.

The RFM logic circuit 112 of the controller 102 counts access operations performed by the access logic 104 on each of the portions 162. For example, each portion 162(0) to 162(N–1) may have an associated count value RFM_Count0 to RFM_CountN–1. Based on those counts the refresh logic circuit 110 performs a mode register read (MRR) operation on the mode register 156 of the memory 150 to determine if the flag associated with that portion is set. If the flag is set, then controller 102 issues an RFM command to the memory 150. If the flag is not set, then the controller 102 skips issuing the RFM command. The refresh control circuit 152 sets each flag based on word line count values, each of which is associate with a word line in the respective portion. For example, if one or more of the word lines in the first portion 162(0) has a count which is over an attack threshold, then the first RFM flag RFM_Flag0 may be set. When the access count for the first portion RFM_Count0 crosses a threshold, the controller 102 may use an MRR operation to check the status of RFM_Flag0 and if it is set, issue an RFM command to the first portion 162(0).

The controller 102 includes an access logic circuit 104 which performs access operations on the memory device 150. Examples of access operations include read operations, where data is read from a specified location in the memory array 160, and write operations, where data is written from the controller 102 to a specified location in the memory array 160. The access logic 104 may send various commands and signals as part of an access operation. For example, the controller 102 may provide a row address, column address, and bank address as well as a read or write command and a row activation command. The addresses and commands may be provided in a specific sequence with timing based on a specification of the memory 150. For the sake of simplicity, only a row address XADD and row activation ACT and pre-charge Pre command are shown in FIG. 1. A row decoder 152 of the memory 150 activates (opens) the word line (row) in the memory array 160 specified by XADD responsive to the ACT command and de-activates (closes) the row responsive to Pre.

The memory array 160 is divided into portions 162. In different embodiments, the portions 162 may represent different levels of organization of the memory array 160. For example, in some embodiments, the portions 162 may represent banks of the memory array 160. The banks may be specified by a bank address. In some embodiments, the portions 160 may represent sub-banks of the memory array 160. In other words, each bank may include a number of portions 162. In some embodiments, the portions 162 may represent bank groups, and each portion 162 may include multiple banks. In the example of FIG. 1, the memory array 160 has been divided into N portions 162(0) to 162(N–1).

Each portion 162 of the memory array 160 includes a number of word lines. In some embodiments, each portions 162 may include a same number of word lines. In other embodiments, the number of word lines in each portion may be different. In the example of FIG. 1, each portion 162 includes M word lines, WL0 to WLM–1.

As part of an access operation, the controller 102 may provide address information which specifies the portion and the word line within that portion. For example, if the portions represents memory banks, then a bank address may specify the portion while a row address XADD may specify the word line. If the portions 162 represent sub-banks, then the portion may be specified by the bank address and the row address while the row address identifies the word line. For example, a portion of the row address may indicate a sub-bank while another portion indicates the word line within that sub-bank.

The controller 102 includes an RFM logic circuit 112 which stores access counts 114, each of which is associated with one of the portions. In this example, there are N access counts, RFM_Count0 to RFM_CountN–1. When the access logic 104 accesses a word line, the RFM logic 112 updates a count value associated with the portion 162 which includes that word line. For example, if a word line is accessed in portion 0 162(0), then the RFM logic circuit 112 will update the count value RFM_Count0. In some embodiments, the RFM logic 112 may increment the count value responsive to an access in the associated portion. In some embodiments, a more complicated update scheme may be used. For example, the count value may be a rolling accumulated activation (RAA) count, which is changed in a first direction (e.g., increased) by an amount responsive to an access operation and changed in a second direction (e.g., decreased) by a different amount responsive to a refresh operation on the associated portion.

When a word line is accessed, the refresh control circuit 154 of the memory 150 changes a count value associated with that word line. For example, the memory 150 may include per-row activity tracking where each word line includes counter memory cells which store a count value associated with the number of times that word line has been accessed. For example, when the row decoder 152 receives a row address XADD and activation signal ACT, it may activate the word line and the count value may be read out to the refresh control circuit 154. The refresh control circuit 154 updates the count value and the updated count value is written back to the counter memory cells. For example, the refresh control circuit 154 may increment the count value.

The updated word line count value is compared to a threshold, such as a hammer threshold or attack threshold. If the updated word line count value is over the threshold, then the row address XADD is added to an aggressor queue of the refresh control circuit 154 and the word line count value is reset. In addition, the refresh control circuit 154 may set an RFM flag associated with the portion which contains the word line. For example, if the word line is in the first portion Portion0 162(0), then a first RFM flag RFM_Flag0 may be set in the mode register 156. In this manner, each flag may be set if at least one word line in that portion has an associated word line count value which is over the attack threshold.

The RFM logic 112 determines when to check a status of the flags (e.g., when to check if an RFM operation is called for) based on the RFM count values 114. For example, when an RFM count value is updated, it may be compared to an RFM threshold. If the RFM count value has crossed the threshold, then the RFM logic 110 may signal that the controller 102 should check a status of the associated RFM flag 158 in the mode register 156 of the memory. The controller 102 may check the status of the RFM flag 158 by performing a mode register read (MRR) operation. The register or registers which contain the RFM flags 158 may be readable even when access operations are ongoing. For example, the controller 102 may read a status of an RFM flag associated with a first bank while performing an access operation on a second bank.

In an example implementation, the RFM logic circuit 112 may increment the RFM count value each time a word line is accessed in the associated portion 162. When the RFM count value 114 crosses a threshold value, the RFM logic circuit 112 may cause the controller 102 to check a status of the associated RFM flag, and then reset the RFM count value. In this manner, the RFM flag for a given portion may be checked every threshold value number of accesses to that portion. Other schemes for determining when to check the RFM flag may be used in other example embodiments.

The refresh logic 110 sends refresh commands REF to the memory 150. Responsive to the refresh command REF, the refresh control circuit may perform one or more refresh operations. The refresh operations may be normal refresh operations, targeted refresh operations, or a combination thereof. In some embodiments, the memory 150 may only perform normal refresh operations responsive to the refresh command REF, and may only perform targeted refresh commands responsive to the RFM command RFM.

In a normal refresh operation, the refresh control circuit 154 generates a refresh address based on a sequence of addresses, and the row decoder 152 refreshes one or more word lines associated with the refresh address. In a targeted refresh operation, the refresh control circuit 154 generates a refresh address based on one of the addresses stored in the aggressor queue and the row decoder 152 refreshes one or more word lines associated with the refresh address. When a refresh address is generated as part of a targeted refresh address, the address is removed from the queue. In some embodiments, there may be a separate queue for each portion 162 of the array 160. If the queue becomes empty, the RFM flag associated with that portion may be unset.

When the controller checks the RFM flag for a portion, if the flag is set, the controller 102 issues an RFM command to that portion. Responsive to the RFM command, the refresh control circuit performs a targeted refresh operation on the specified portion 162. In this manner, the controller 102 may determine when to check if an RFM command should be performed based on a number of accesses to a portion, and may only send the RFM command if the memory 150 indicates that one or more word lines within that portion are ready for a targeted refresh operation. In other words, the controller 102 may count accesses on a portion-by-portion basis, while the memory 150 may count the accesses to individual word lines within each portion.

Figure 2:
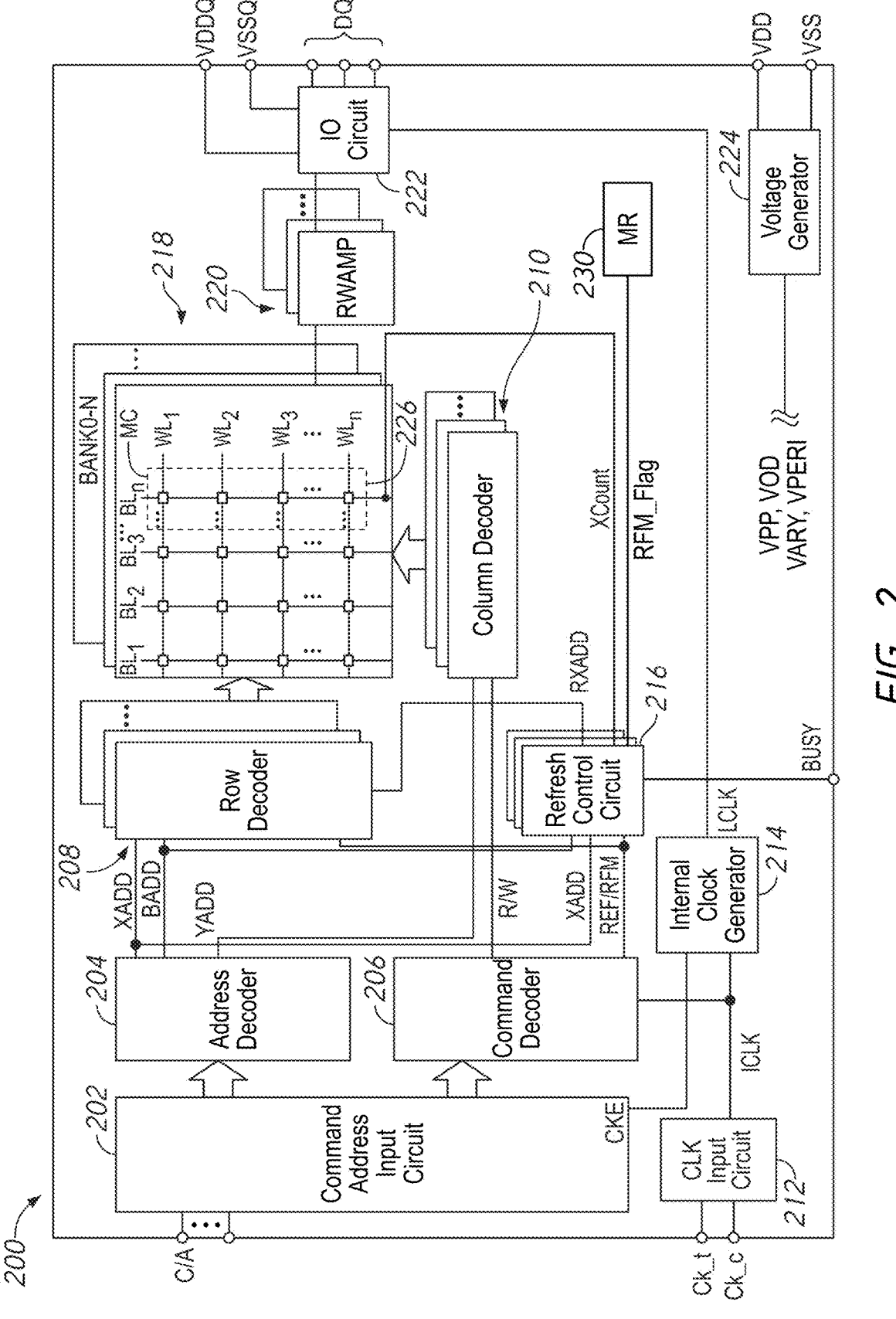
FIG. 2 is a block diagram of a semiconductor device according to at least one embodiment of the disclosure.

FIG. 2 is a block diagram of a semiconductor device according to at least one embodiment of the disclosure. The semiconductor device 200 may be a semiconductor memory device, such as a DRAM device integrated on a single semiconductor chip. The device 200 may be operated by a controller, such as the controller 102 of FIG. 1. The controller may be any device (or collection of devices) which stores information on the memory. For example, the controller may be a processor. In some embodiments, the controller and memory 200 may be packaged together on a single integrated circuit. In some embodiments, the controller and memory 200 may be separate. In some embodiments, the controller may operate multiple memory devices 200.

The semiconductor device 200 includes a memory array 218 (e.g., 160 of FIG. 1). The memory array 218 is shown as including a plurality of memory banks. In the embodiment of FIG. 1, the memory array 218 is shown as including eight memory banks BANK0-BANK7. More or fewer banks may be included in the memory array 218 of other embodiments. Each memory bank includes a plurality of word lines WL (rows), a plurality of bit lines BL (columns), and a plurality of memory cells MC arranged at intersections of the plurality of word lines WL and the plurality of bit lines BL. Each bank is associated with a value of a bank address BADD. In some embodiments, the banks may represent the portions 162 of FIG. 1.

The selection of the word line WL is performed by a row decoder 208 and the selection of the bit lines BL is performed by a column decoder 210. In the embodiment of FIG. 2, the row decoder 208 includes a respective row decoder for each memory bank and the column decoder 210 includes a respective column decoder for each memory bank. The bit lines BL are coupled to a respective sense amplifier (SAMP). Read data from the bit line BL is amplified by the sense amplifier SAMP, and transferred to read/write amplifiers 220 over complementary local data lines (LIOT/B), transfer gate (TG), and complementary main data lines (MIOT/B). Conversely, write data outputted from the read/write amplifiers 220 is transferred to the sense amplifier SAMP over the complementary main data lines MIOT/B, the transfer gate TG, and the complementary local data lines LIOT/B, and written in the memory cell MC coupled to the bit line BL.

The semiconductor device 200 may employ a plurality of external terminals coupled to the controller. The external terminals include command and address (C/A) terminals coupled to the controller along a command and address bus to receive commands and addresses. Other external terminals include clock terminals to receive clocks clock signals CK and /CK along a clock bus, data terminals DQ to send and receive data along a data bus, and power supply terminals to receive power supply potentials such as VDD, VSS, VDDQ, and VSSQ.

The clock terminals are supplied by the controller with external clocks CK and /CK that are provided to an input circuit 212. The external clocks may be complementary. The input circuit 212 generates an internal clock ICLK based on the CK and /CK clocks. The ICLK clock is provided to the command decoder 210 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses by the controller. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The address decoder 204 may also supply a decoded bank address BADD, which may indicate the bank of the memory array 218 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 206 via the command/address input circuit 202. The command decoder 206 includes circuits to decode the internal command signals to generate various internal signals and commands for performing operations. For example, the command decoder 206 may provide a row command signal to select a word line and a column command signal to select a bit line.

As part of an example read operation, the device 200 may a read command along with memory addresses which indicate where the read command should be performed. Responsive to the read command, data is read out from the memory cells of the bank specified by BADD at the intersection of the row specified by XADD and the columns specified by YADD. The read command is received by the command decoder 206, which provides internal commands so that read data from the memory array 218 is provided to the read/write amplifiers 220. The read data is output to the controller from the data terminals DQ via the input/output circuit 222.

As part of an example write operation, the device 200 may receive a write command along with data to be written to the array and memory addresses which indicate where the write operation should be performed. Responsive to the write command, the data is written to the bank specified by BADD at the memory cells at the intersection of the word line specified by XADD and the columns specified by YADD. The write command is received by the command decoder 1206, which provides internal commands so that the write data is received by data receivers in the input/output circuit 222. Write clocks may also be provided to the external clock terminals for timing the receipt of the write data by the data receivers of the input/output circuit 222. The write data is supplied via the input/output circuit 222 to the read/write amplifiers 120, and by the read/write amplifiers 120 to the memory array 218 to be written into the memory cells MC specified by the addresses.

The device 200 may also receive commands causing it to carry out refresh operations. For example, the controller may issue a refresh command REF or a refresh management command RFM. Responsive to either the REF command or the RFM, the refresh control circuit 216 (e.g., 154 of FIG. 1) may perform one or more refresh operations. As part of a refresh operation, the refresh control circuit 216 issues a refresh address RXADD, and the row decoder 208 may refresh one or more word lines based on the refresh address RXADD. The number and type of refresh operations performed may vary based on whether REF or RFM is received. In some embodiments, the refresh control circuit 216 may be repeated on a bank-by-bank basis, similar to the row decoder 208 and column decoder 210.

The refresh commands REF and RFM are supplied to the refresh address control circuit 216. The refresh address control circuit 216 supplies one or more refresh addresses RXADD to the row decoder 208, which refreshes one or more wordlines WL identified by the refresh row address RXADD. For example, in some embodiments, the refresh control circuit 216 may perform a mix of normal (or sequential) refresh operations and targeted refresh operations responsive to the refresh command REF, and may perform targeted refresh operations responsive to the RFM command RFM. In some embodiments, the refresh control circuit 216 may perform normal refresh operations responsive to REF and targeted refresh commands responsive to RFM.

The refresh control circuit 216 may perform a sequential refresh operation, or normal refresh operation, by issuing one or more sequential refresh addresses as RXADD. The sequential refresh addresses may be generated based on a sequence of addresses. For example, after issuing a sequential refresh address, a counter circuit may increment the address to generate the next address in the sequence (e.g., RXADD(i)=RXADD(i−1)+1). The refresh address control circuit 216 may cycle through the sequence of sequential addresses at a rate determined by REF. In some embodiments, the sequence of sequential addresses may include all the addresses in the memory bank 218. In some embodiments, the controller may issue the signal REF with a frequency such that most or all of the addresses in the memory bank 218 are refreshed within a certain period (e.g., such that there is a maximum specified time between two consecutive sequential refreshes of a given word line), which may be based on an expected rate at which information in the memory cells MC decays. In some embodiments, the rate at which the controller issues REF may be based, in part, on a refresh interval and a refresh interval multiplier read from the mode register 230. The refresh interval multiplier may be based on conditions of the memory 200, such as a temperature read by a temperature sensor (not shown in FIG. 2).

The refresh control circuit 216 may perform a targeted refresh operation (e.g., responsive to RFM). The refresh control circuit 216 identifies addresses as targets for targeted refresh operations. These addresses may generally be referred to as aggressors, although different embodiments may use different criteria for identifying these addresses. The refresh control circuit 216 may include a register which stores identified aggressors. As part of a targeted refresh operation, one or more refresh addresses are generated based on a selected aggressor. For example, in some embodiments, the refresh addresses may represent word lines which are physically adjacent to the word line associated with the identified aggressor address (e.g., RXADD=XADD+/−1). Other relationships may be used in other example embodiments. For example word lines which are further away (e.g., RXADD=XADD+/−2, +/−3, etc.) may be refreshed.

The memory device 200 may use one or more systems to determine which address(es) are aggressors. For example, the device 200 may use per-row activity tracking where each word line has an associated access count value. In the example embodiment of FIG. 1, some of the memory cells of the array 118 may be set aside for use in tracking aggressor rows. The memory cells 126 which are set aside for such a purpose may generally be referred to as counter memory cells 126. The counter memory cells may store count values XCount, each of which is associated with one of the word lines. For example, each count value XCount may be stored in counter memory cells 126 along the word line that the count value is associated with. The count value XCount may be stored as a binary number, with each bit stored in a memory cell along the word line. For the sake of simplicity of illustration, only a single example counter memory cell and bit line is shown in FIG. 2, however more counter memory cells 226 per word line may be used in other example embodiments. The number of counter memory cells along each word line may be based on a number of bits of the count value XCount. In some embodiments, extra counter memory cells (e.g., more than the length of the number XCount) may be used, for example to store error correction information for the count value XCount.

The counter memory cells 226 may be referred to as such due to their use (storing the count values) and in some embodiments may be structurally similar to, or identical to, the other memory cells of the array. In some embodiments, the counter memory cells 226 may be grouped together (e.g., at the end of the word line). Other distributions of the counter memory cells 226 along the word line may be used in other example embodiments. In some embodiments, the counter memory cells 226 may not be directly accessible by external devices such as controllers (e.g., to prevent the count values from being overwritten). In other words, the bit lines associated with the counter memory cells 226 may not be accessed by a normal column address.

The count values XCount may be used to determine if the associated word line is an aggressor or not. For example, each time the word line is accessed, the count value XCount may be read out to the refresh control circuit which may update the count, compare the updated count to a threshold and write the updated count back to the counter memory cells 226. For example the count may be updated by being incremented. If the updated count crosses the threshold, then the row address XADD associated with the word line (and the count XCount) may be stored as an aggressor and the count value may be updated again by being reset to an initial value (e.g., 0). In some embodiments, the threshold may represent a maximum value of the count and the count may cross the threshold by 'rolling over' back to the initial value (e.g., from 11111111 to 00000000).

The memory device 200 includes a mode register 230 (e.g., 156 of FIG. 1) which includes a number of registers. The registers may store information about the memory 200, settings which control an operation of the memory 200, or combinations thereof. For example, the mode register 230 may include a number of RFM flags. The RFM flags may each be associated with a portion of the memory array 218. For example, in some embodiments there may be an RFM flag for each bank of the memory 218. The refresh control circuit 216 may set and unset the RFM flags. For example, the refresh control circuit 216 may include an aggressor queue for each RFM flag (e.g., for each portion of memory array). When the aggressor queue for a portion is non-empty (e.g., the count XCount for at least one word line in that portion has crossed the aggressor threshold and has not yet been refreshed) the refresh control circuit 216 sets the RFM flag in the mode register 230 associated with that portion. When the aggressor queue for a portion becomes empty (e.g., due to a targeted refresh operation) the refresh control circuit 216 unsets the RFM flag for that portion.

The RFM flags may be stored in registers of the mode register 230 which are readable while the memory device 200 is performing access operations. For example, the memory device 200 may receive a mode register read (MRR) command which specifies one of the RFM flag register. The memory 200 may provide a value of the specified register while still performing access operations on the memory array 218. For example, an RFM flag associated with a first bank may be read while access operations are being performed on a second bank.

The power supply terminals are supplied with power supply potentials VDD and VSS. The power supply potentials VDD and VSS are supplied to an internal voltage generator circuit 224. The internal voltage generator circuit 224 generates various internal potentials VPP, VARY, VPERI, and the like based on the power supply potentials VDD and VSS supplied to the power supply terminals. The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 222 so that power supply noise generated by the input/output circuit 222 does not propagate to the other circuit blocks.

Figure 3:
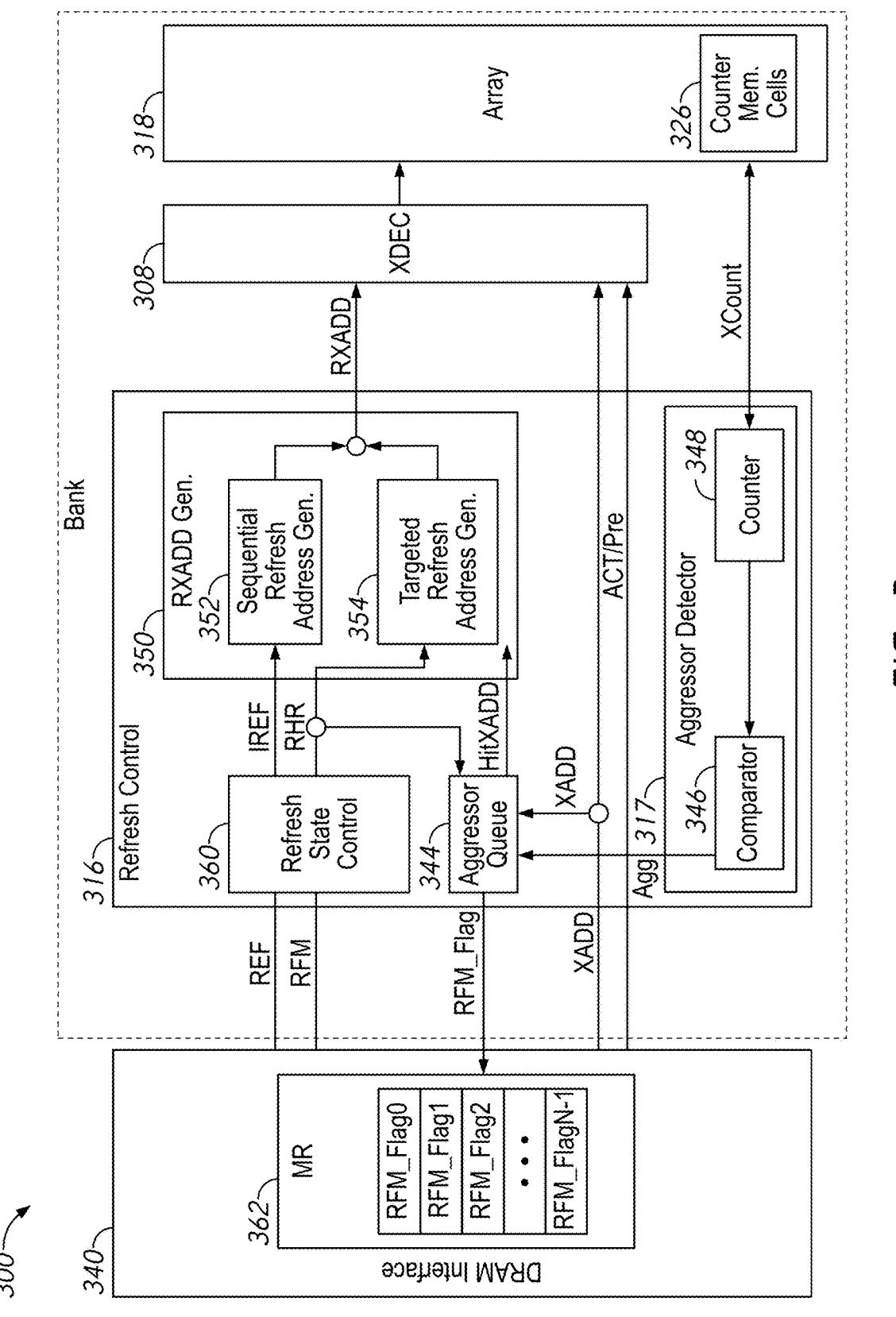
FIG. 3 is a block diagram of a refresh control circuit according to an embodiment of the present disclosure.

FIG. 3 is a block diagram of a refresh control circuit according to an embodiment of the present disclosure. FIG. 3 may show an example layout which may implement a portion of a memory device 300, such as the memory device 300 of FIG. 1. For example, the memory array 318 may implement the memory array 218 of FIG. 2, the row decoder 308 may implement the row decoder 208 of FIG. 2, the refresh control circuit 316 may implement the refresh control circuit 216 of FIG. 2 and so forth.

Certain internal components and signals of the refresh address control circuit 316 are shown to illustrate the operation of the refresh address control circuit 316. For example, the refresh control circuit 316 includes an aggressor address register or aggressor address queue 344 which stores identified aggressor addresses, a refresh address generator 350 which generates the refresh address RXADD and an aggressor detector circuit 317 which determines if an address XADD is an aggressor address HitXADD. The refresh control circuit 216 also includes a refresh state control circuit 360 which controls what type and how many refresh operations are performed responsive to various commands such as REF and RFM.

The dotted line around the refresh address control circuit 316, the row decoder 308, and the memory array 318 is shown to represent that in certain embodiments, each of the components within the dotted line may correspond to a particular bank of memory, and that these components may be repeated for each of the banks of memory. In some embodiments, the components shown within the dotted line may be associated with each of the memory banks. Thus, there may be multiple refresh address control circuits 316 each with their own aggressor addresses in their own aggressor queues 344. For the sake of brevity, components for only a single bank will be described. In some embodiments, one or more of the components within the dotted line box may be repeated on a portion-by-portion (e.g., the portions 162 of FIG. 1) basis instead of (or in addition to) a bank-by-bank basis. For example, if the portions are sub-banks, there may be an aggressor queue 344 for each sub-bank.

A DRAM interface 340 may provide one or more signals to an address refresh control circuit 316 and row decoder 308 which in turn (along with a column decoder, not shown) may perform access operation on a memory array 318. The DRAM interface 340 represents various components of the memory which send, receive, and/or decode signals to/from the controller as part of access operations. For example the DRAM interface 340 may represent a command/address input circuit (e.g., 202 of FIG. 2), address decoder (e.g., 204 of FIG. 2) and command decoder (e.g., 206 of FIG. 2). During an example access operation, the DRAM interface 340 provides a row address XADD, as well as an activation signal ACT. The DRAM interface 340 also provides commands such as the refresh command REF and refresh management command RFM received from a controller (e.g., 102 of FIG. 1).

The refresh state control circuit 360 performs one or more refresh operations responsive to the commands REF and RFM. A refresh state control circuit 360 determines how many refresh operations and of what type to perform responsive to one or the other of the commands. The refresh state control circuit generates an internal refresh signals IREF and a targeted refresh signal RHR. In some embodiments, the signal IREF being active indicates a refresh operation should be performed, and whether the signal RHR is also active or not determines a type of refresh operation. For example, if IREF alone is active, a normal refresh operation may be performed. If IREF and RHR are both active, then a targeted refresh operation may be performed. Other patterns of signal activation may be used in other example embodiments.

The refresh state control circuit 360 may perform a number of refresh 'pumps' responsive to each activation of the refresh signal REF. A refresh operation may be performed for each pump. For example, each time REF is received, the refresh state control circuit may provide several activations of IREF. In some embodiments, some of the pumps performed responsive to REF may be normal refresh operations (e.g., IREF alone is active) and some may be targeted refresh operations (e.g., IREF and RHR are active). In some embodiments, only normal refresh operations may be performed responsive to REF. The refresh state control circuit 360 may also perform a number of refresh pumps responsive to RFM, however all the pumps provided responsive to RFM may be targeted refresh operations. The number of pumps performed responsive to REF and RFM may be the same or different.

As part of the normal refresh operation, the refresh address generator circuit 350 provides one or more refresh addresses RXADD which are generated by the sequential refresh address circuit 352. The sequential refresh address generator circuit may use logic to generate each new refresh address as part of a sequence. Each new sequential refresh address may be based on a previous sequential refresh address. In other words, sequence logic may be used to update the previous refresh address provided by the sequential address generator circuit 352 to generate the next refresh address which will be provided by the sequential address generator circuit 352. For example, the sequential refresh address generator circuit 352 may include a counter circuit which updates a value of the previous sequential refresh address to generate a new sequential refresh address (e.g., RXADD(i)=RXADD(i−1)+1). Other logic may be used to generate the sequence of sequential refresh addresses in other example embodiments.

As part of the targeted refresh operations, a targeted refresh address generator circuit 354 of the refresh address generator 350 provides one or more targeted refresh addresses as the refresh address RXADD. A targeted refresh address generator circuit 354 of the refresh address generator 350 generates the targeted refresh addresses based on an identified aggressor address HitXADD stored in the aggressor queue 344. For example, the targeted refresh address generator 354 may generate two targeted refresh addresses based on the aggressor address HitXADD which represent the word lines in the array 318 which are adjacent to HitXADD (e.g., RXADD=HitXADD+/−1). Other numbers of address per aggressor and other methods of generating the refresh address based on the aggressor may be used in other example embodiments. Once all of the refresh addresses for a given aggressor HitXADD have been generated, the address HitXADD may be removed from the aggressor queue 344.

Responsive to the refresh address RXADD (whether sequential or targeted) and the signals IREF and/or RHR, the row decoder 308 refreshes the memory cells along the word line(s) indicated by the refresh address. In some embodiments, the normal refresh address may indicate a different number of word lines than the targeted refresh address. For example, the normal refresh address may be associated normal more word lines than the targeted refresh address. In some embodiments, the sequential refresh address may be associated with multiple word lines while the targeted refresh address is associated with a single word line.

The refresh control circuit 316 includes an aggressor detector circuit 317 which determines if the current address XADD should be stored in the aggressor queue 344 as an aggressor address. Various schemes may be used to determine if an address is an aggressor. In the example embodiment shown in FIG. 3, counter memory cells 326 in the memory array 318 are used to track an access count associated with that word line. The aggressor detector circuit 317 includes a counter circuit 348 which updates the count value XCount of the accessed word line, and a comparator circuit 346 which determines if the address XADD is an aggressor based on the updated count value.

When a row of the memory array 318 is accessed, the values of the counter memory cells 326 along that row are read to the counter circuit 346. The counter memory cells 326 may store the bits of a binary number that represents the count value. For example, if the number is a 16-bit number, then 16 or more counter memory cells may store the bits of the number. The counter 346 may determine a value of the access count for that row based on the values read from the counter memory cells 326. The counter 346 may be a count control circuit, which may manage a value of the count stored in the counter memory cells 326 (e.g., by reading the raw data in the counter memory cells 326 as a numerical value, writing new numerical values to the counter memory cells 326 etc.). The counter circuit 346 may change the count value (e.g., by incrementing the count value) and provide the changed count value to a threshold comparator 346, which may determine if the value of the changed count crosses a threshold (e.g., if the value is greater than or greater than or equal to the threshold). If the value does not cross the threshold (e.g., if the value is less than or equal to or less than the threshold), then the counter circuit 348 may write the changed count back to the counter memory cells 326. If the value does cross the threshold, then the current address XADD may be determined to be an aggressor address HitXADD and the threshold comparator circuit 346 provides an aggressor detected signal Agg to the aggressor queue 344. Responsive to the signal Agg, the aggressor address register 344 stores the row address XADD. Also responsive to the signal Agg, the counter circuit 348 may change the count value XCount. In some embodiments, the count value may be reset (e.g., to an initial value) or changed in an opposite direction than the direction it is changed responsive to an access (e.g., if the count is increased for an access, it may be decreased responsive to signal Agg).

In some embodiments, the changing of the count value may be inherent and the comparator circuit 346 may be omitted. For example, the threshold may be set as a maximum value of the count value XCount, and when XCount reaches that threshold and is incremented again, the count may roll over back to an initial value (e.g., 0). When the counter circuit 348 rolls the value over to the initial value, the counter circuit 348 provides the aggressor detected signal Agg.

In some embodiments, the aggressor detector circuit 317 may be located in a region of the memory device closer to the array 318 than the remainder of the refresh control circuit 316. For example, the aggressor detector 317 may be in a bank logic region associated with the array 318, while the remainder of the components may be in a more central region.

In some embodiments, when the aggressor queue 344 includes at least one address, the refresh control circuit 316 may set an associated RFM flag in the mode register 362. For example, when an address is added to the aggressor queue 344, a signal may be sent which sets the associated RFM flag. When the aggressor queue 344 becomes empty, the associated RFM flag may be unset. For example, if a targeted refresh operation is performed and that removes the final aggressor address in the queue 344, then a signal may be sent which unsets the associated RFM flag. In some embodiments, each of the RFM flags may be single bit, and the flag may be set when the bit is in a first state (e.g., a logical high) and unset when the bit is in a second state (e.g., a logical low).

Figure 4:
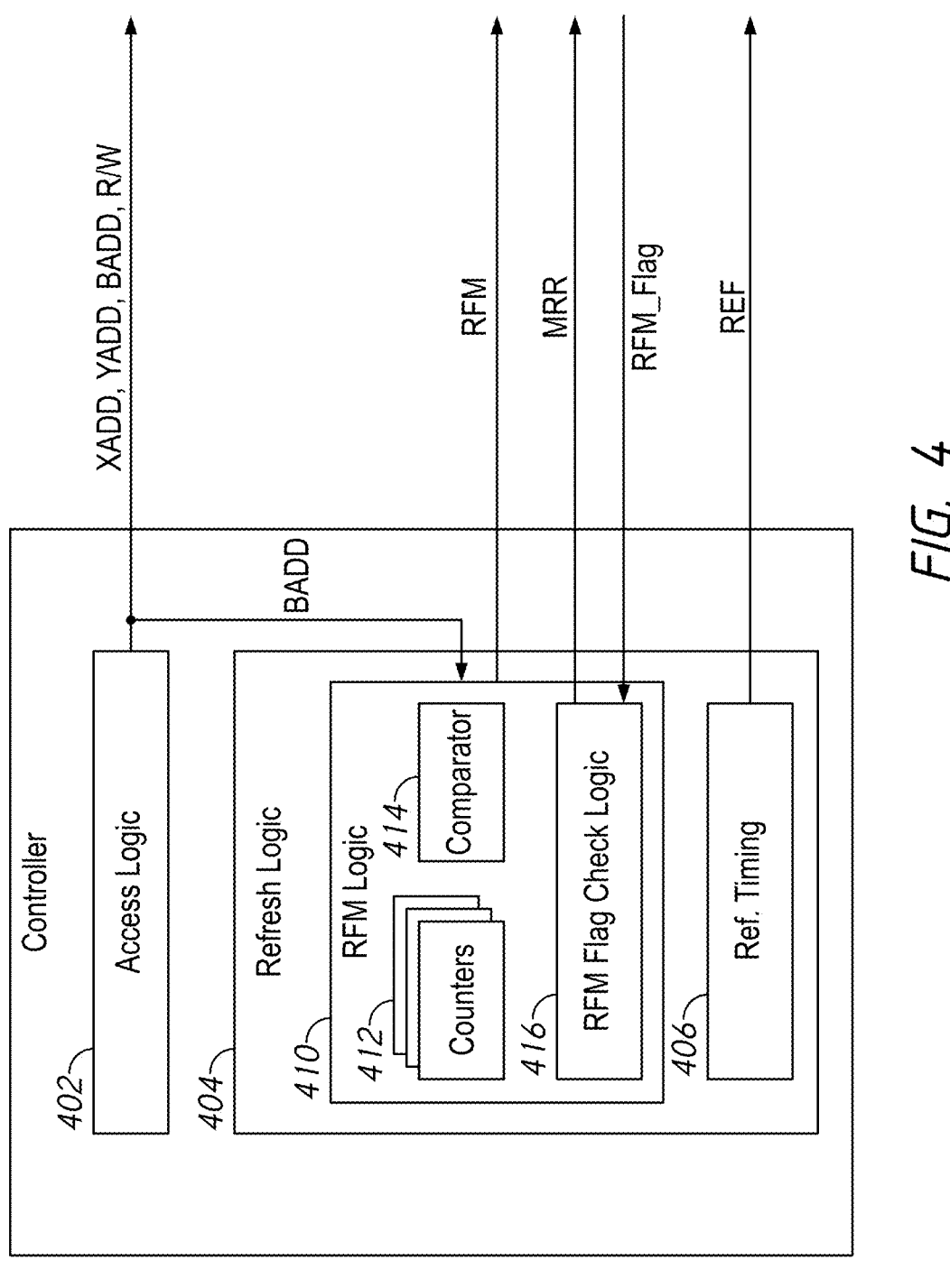
FIG. 4 is a block diagram of a controller according to some embodiments of the present disclosure.

FIG. 4 is a block diagram of a controller according to some embodiments of the present disclosure. The controller 400 may, in some embodiments, implement the controller 102 of FIG. 1. The controller 400 operates a memory such as the memory 150 of FIG. 1, 200 of FIGS. 2 and/or 300 of FIG. 3. The controller 400 operates the memory by sending and receiving various signals, such as commands, addresses, and/or data along various buses. For the sake of clarity, only certain signals are shown in FIG. 4, and other signals and their buses have been omitted.

The controller 400 includes an access logic circuit 402 (e.g., 104 of FIG. 1) which controls when access commands are sent to the memory. The access logic 402 may perform an access operation by providing commands and addresses along a C/A bus to the C/A terminal of the memory. For example, the access logic 402 may provide a row, column, and bank address (XADD, YADD, and BADD respectively) as well as a command (e.g., a read or write command R/W) along the C/A bus. The access logic 402 may also provide other signals not shown in FIG. 4, such as the row activation and precharge commands ACT/Pre.

The controller 400 also includes a refresh logic circuit 404 (e.g., 110 of FIG. 1), which determines when and what type of refresh command to send to the memory. For example, the refresh logic circuit 404 may provide a refresh command REF and a refresh management command RFM. The refresh logic circuit 404 includes a refresh timing circuit 406 which provides the refresh signal REF. The refresh signal may be provided with periodic timing. For example, the refresh timing circuit 406 may count activations (e.g., rising and/or falling edges) of a clock signal and provide the refresh signal REF at least once every N activations of the clock signal.

In some embodiments, how long between refresh commands REF may be based on properties of the memory. For example, a mode register (e.g., 156 of FIG. 1, 230 of FIGS. 2 and/or 362 of FIG. 3) may include a register which specifies a default refresh interval and a register which specifies a refresh interval multiplier. The refresh timing circuit 406 may multiply the default refresh interval by the refresh interval multiplier to determine a refresh interval, and provide the refresh command REF at least once every refresh interval. The controller 400 may periodically check the value of refresh interval multiplier, for example by periodically performing a mode register read operation.

The refresh logic circuit 404 also includes an RFM logic circuit 410 (e.g., 112 of FIG. 1), which determines when to provide the refresh management command RFM. The RFM logic circuit 410 tracks accesses to different portions of the memory, and determines when to check an RFM flag associated with the portion based on the respective accesses. If the flag is set, an RFM command is sent to that portion. In the example embodiment of FIG. 4, the access counting, RFM flags, and RFM commands are on a bank-by-bank level, however other sub-divisions of the memory array (e.g., sub-bank, bank groups, all banks) are possible in other example embodiments.

The RFM logic circuit 410 includes a number of RFM counters 412 (e.g., 114 of FIG. 1) each of which is associated with a portion of the memory array, in this case with a bank of the memory array. When the access logic 402 accesses a bank, the associated counter 412 is updated. For example, the RFM logic circuit 410 may receive a bank address BADD to determine which bank is accessed. In an example implementation, when the bank is accessed, the associated counter may be incremented. The updated count value is compared to a threshold by a comparator circuit 414. If the updated count value has crossed the threshold, then the comparator 414 may signal an RFM flag check logic 416 to check the status of the associated flag in the memory. Responsive to the flag being checked, the RFM logic circuit 410 may reset the count value for that portion.

In another example embodiment, the counter may be a rolling accumulated activation RAA counter. The counter may change the count value in a first direction (e.g., increase) by a first amount responsive to the bank address BADD, and may change the count value in a second direction (e.g., decrease) by a second amount responsive to a refresh command REF being issued to that bank. Other actions may also change the counter in the first or second direction. When the comparator 414 determines that the count value has crossed the threshold, the count value may be changed in the second direction (e.g., by the second amount or by a different amount) and then signal the RFM flag check logic 416 to check the status of the associated flag.

The RFM flag check logic circuit 416 is notified by the comparator circuit 414 to check an RFM flag in the memory for a specific portion (e.g., as specified by the comparator 414 based on which count value triggered the check). The RFM flag check logic 416 performs a check by performing a MRR operation on the mode register which stores the RFM flag associated with the specified portion. Responsive to the MRR operation, the controller 400 receives the value of the specified RFM flag RFM_Flag. If the RFM_Flag is set (e.g., at a logical high) then the refresh logic circuit 404 issues a RFM command to the specified portion. If the RFM_Flag is unset (e.g., at a logical low) then the refresh logic circuit 404 does not issue an RFM command.

Figure 5:
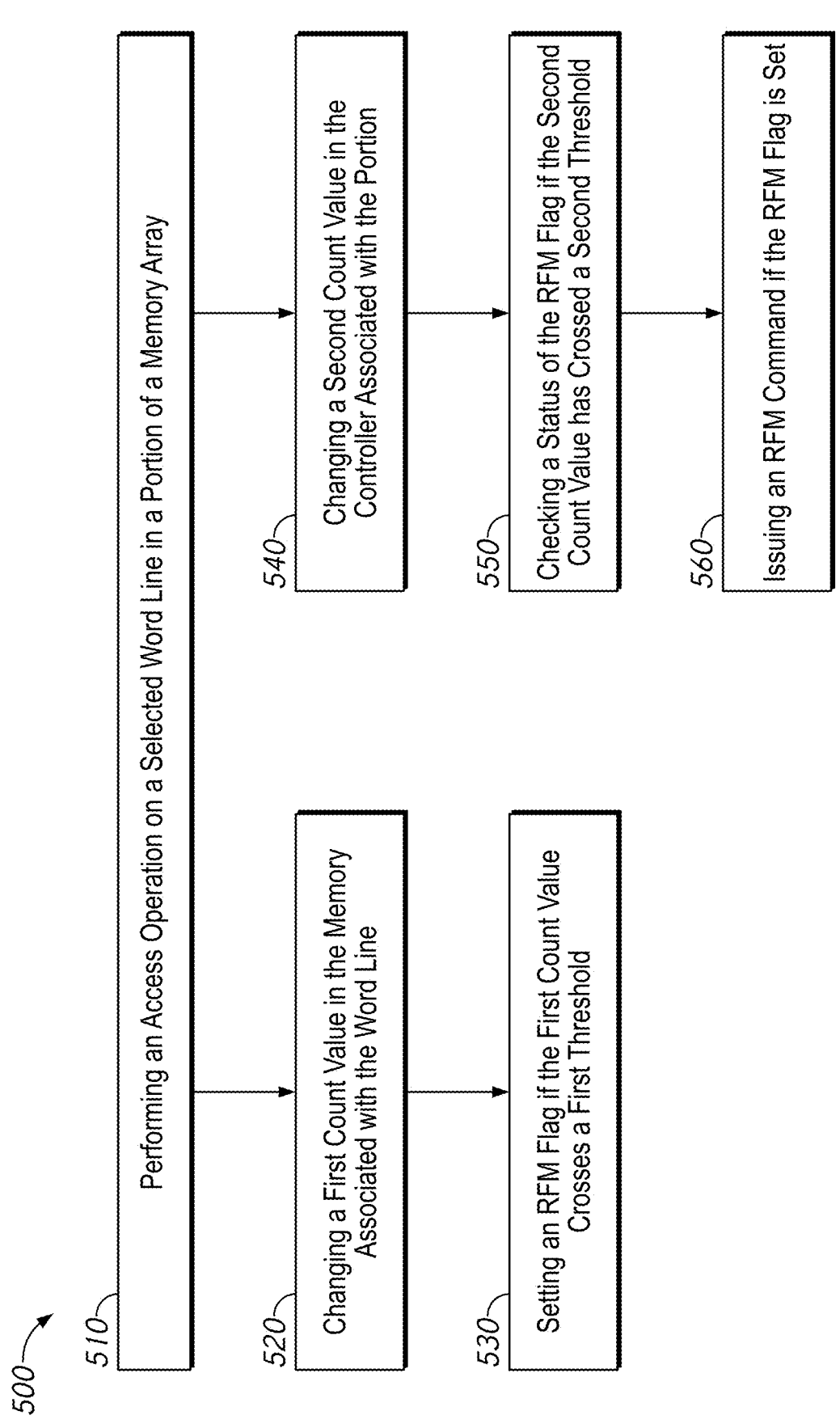
FIG. 5 is a flow chart of a method according to some embodiments of the present disclosure.

FIG. 5 is a flow chart of a method according to some embodiments of the present disclosure. The method 500 may, in some embodiments, be performed by one or more of the apparatuses or systems described herein. For example, the method 500 may, in some embodiments, be performed by the memory system 100 of FIG. 1, memory device 200 of FIG. 2, memory device 300 of FIG. 3, and/or controller 400 of FIG. 4. The method 500 includes steps which are performed by a controller (e.g., 102 of FIGS. 1 and/or 400 of FIG. 4) and steps which are performed by a memory (e.g., 150 of FIG. 1, 200 of FIG. 2, and/or 300 of FIG. 3). Boxes 510-530 may represent steps which are performed by a memory device and 540-560 may represent steps which are performed by a controller.

The method 500 may begin with box 510, which describes performing an access operation on a selected word line in a portion of a memory array in a memory device. For example, the method 500 may include providing a row address and an access command (e.g., a read or write command) from the controller to the memory and receiving the row address and the access command with the memory. The method 500 may include providing address information from the controller which identifies the portion and receiving the address information with the memory. For example, if the portion is a memory bank, the method 500 may include providing a bank address which identifies the portion. In another example, if the portion is a sub-bank, then the method 500 may include providing a bank address which identifies the bank and providing a row address, a portion of which identifies the sub-bank within the bank.

Box 510 is followed by boxes 520 and 540. Boxes 520 and 540 may represent operations which are performed independently in the memory and the controller (respectively) responsive to the access operation. The steps of boxes 520-530 may represent operations which are performed responsive to the memory receiving an access command and performing the access operation, while the steps of boxes 540-560 may represent operations which are performed responsive to the controller providing the access command to the memory.

Box 520 describes changing a first count value (e.g., XCount) in the memory associated with the word line. In some embodiments, the first count value may be stored along the word line, for example in counter memory cells such as 226 of FIGS. 2 and/or 326 of FIG. 3. The method 500 may include reading the first count value from the word line, changing the first count value and writing the changed count value back to the word line responsive to performing the access operation. For example, the method may include incrementing the first count value responsive to performing the access operation.

Box 520 is followed by box 530, which describes setting an RFM flag associated with the portion if the first count value crosses a first threshold. For example, the method 500 may include comparing the changed first count value to the first threshold and setting the RFM flag if the first count value is greater than or equal to (or greater than) the first threshold. In some embodiments, the method 500 may include rolling over the first count value to an initial value and using that as the first count value crossing the first threshold. In some embodiments, the method 500 may include adding a row address associated with the word line to an aggressor queue if the first count value crosses the first threshold.

The method 500 may include setting the RFM flag if any of a first plurality of count values, each associated with one of a plurality of word lines in the portion, cross the first threshold. The method 500 may include unsetting the RFM flag if none of the first plurality of count values have crossed the first threshold. For example, the method 500 may include setting the RFM flag if there is at least one address in the aggressor queue associated with the first portion and unsetting the RFM flag if the associated aggressor queue is empty.

The method 500 include box 540, which describes changing a second count value (e.g., 114 of FIGS. 1 and/or 412 of FIG. 4) in the controller responsive to performing the access operation. The second count value is associated with the portion. For example, the method 500 may include incrementing the second count value responsive to the access operation. An RFM logic circuit of the controller may receive an address associated with the portion (e.g., a bank address) and change the second count value responsive to the address.

Box 540 is followed by box 550, which describes checking a status of the RFM flag in the memory if the second count value has crossed a second threshold. The method 500 may include comparing the second count value to the second threshold value and checking the status of the RFM flag when the second count value is greater than or equal to (or greater than) the second threshold value. The method 500 may include resetting the second count value after checking the status. In some embodiments, the method 500 may include rolling over the second count value to an initial value and checking the status responsive to the second count value rolling over.

The checking the status may include issuing a MRR command to a mode register of the memory. The MRR command may specify a register which holds the RFM flag associated with the portion. The RFM flag may be one of a plurality of RFM flags, each associated with a different portion. The method 500 may include providing the value of the RFM flag from the memory to the controller. The method 500 may include checking the RFM flag while performing an access operation on a different portion of the memory.

Box 550 may be followed by box 560, which describes issuing an RFM command from the controller to the memory if the flag is set. The method 500 may include not issuing the RFM command if the flag is unset. The method 500 may include performing one or more targeted refresh operations with the memory responsive to the RFM command. Performing the targeted refresh operation may include generating a refresh address based on an address in the aggressor queue and refreshing one or more word lines in the portion based on the refresh address. The method may include removing the address from the aggressor queue after performing the targeted refresh operation.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array including:
  a first portion comprising a first plurality of word lines;
  a second portion comprising a second plurality of word lines;
a mode register comprising a first refresh management (RFM) flag associated with the first portion and a second RFM flag associated with the second portion;
a first refresh control circuit configured to set the first RFM flag based on a first plurality of count values, each associated with one of the first plurality of word lines; and
a second refresh control circuit configured to set the second RFM flag based on a second plurality of count values, each associated with one of the second plurality of word lines,
wherein the first refresh control circuit is configured to set the first RFM flag if the first aggressor queue includes at least one address and wherein the second refresh control circuit is configured to set the second RFM flag if the second aggressor queue includes at least one address.

2. The apparatus of claim 1, wherein the mode register is configured to provide a status of the first RFM flag while accessing the second portion of the memory array.

3. The apparatus of claim 1, wherein the first portion is a first bank and the second portion is a second bank.

4. The apparatus of claim 1, wherein the first portion is a first sub-bank and the second portion is a second sub-bank.

5. The apparatus of claim 1, wherein the first plurality of word lines is configured to store the first plurality of count values, and
wherein the second plurality of word lines is configured to store the second plurality of count values.

6. The apparatus of claim 1, wherein the first refresh control circuit includes a first aggressor queue configured to store aggressor addresses based on the first plurality of count values, and
wherein the second refresh control circuit includes a second aggressor queue configured to store aggressor addresses based on the second plurality of count values.

7. The apparatus of claim 1, wherein the first refresh control circuit is configured to perform a targeted refresh operation responsive to an RFM command directed to the first portion, and
wherein the second refresh control circuit is configured to perform a targeted refresh operation responsive to an RFM command directed to the second portion.

8. The apparatus of claim 1, wherein the first refresh control circuit is configured to set the first RFM flag if at least one of the first plurality of count values is above a threshold and to unset the first RFM flag if none of the first plurality of count values is above the threshold, and
wherein the second refresh control circuit is configured to set the second RFM flag if at least one of the second plurality of count values is above the threshold and to unset the second RFM flag if none of the second plurality of count values is above the threshold.

9. The apparatus of claim 1, wherein the first refresh control circuit is configured to change a selected one of the first count values responsive to the associated one of the first plurality of word lines being accessed, and
wherein the second refresh control circuit is configured to change a selected one of the second count values responsive to the associated one of the second plurality of word lines being accessed.

10. A system comprising:
a memory comprising:
  a memory array comprising a plurality of portions, each of the plurality of portions comprising a respective plurality of word lines each associated with a respective one of a plurality of count values;
  a mode register comprising a plurality of refresh management flags, each associated with one of the plurality of portions; and
  a plurality of refresh control circuits configured to set or unset the plurality of RFM flags based on the plurality of count values associated with the one of the plurality of portions associated with the RFM flag; and
a controller configured to count a number of access operations to each of the plurality of portions, check the associated one of the plurality of RFM flags based on the count value and provide an RFM command to the memory if the checked associated one of the plurality of RFM flags is set.

11. The system of claim 10, wherein the plurality of refresh control circuits are configured to set the associated one of the plurality of RFM flags if any of the associated plurality of count values is above a threshold and to unset the associated one of the plurality of RFM flags if none of the associated plurality of count values is above the threshold.

12. The system of claim 10, wherein the plurality of refresh control circuits are configured to change a value of a selected one of the associated plurality of count values responsive to a selected one of the associated plurality of word lines being accessed.

13. The system of claim 10, wherein the controller is configured to check the associated one of the plurality of RFM flags responsive to the number of access operations crossing a threshold.

14. The system of claim 10, wherein the controller is configured to check the associated one of the plurality of RFM flags by performing a mode register read operation on the memory.

15. The system of claim 14, wherein the controller is configured to perform an access operation on a different portion of the memory while performing the mode register read operation.

16. A method comprising:
performing an access operation with a controller on a selected word line in a portion of a memory array of a memory;
changing a first count value in the memory responsive to performing the access operation on the selected word line, wherein the first count value is associated with the selected word line;
setting a refresh management (RFM) flag in the memory if the first count value crosses a first threshold;
changing a second count value in the controller responsive to performing the access operation on the portion, wherein the second count value is associated with the portion;

checking a status of the RFM flag if the second count value has crossed a second threshold; and issuing an RFM command to the memory if the RFM flag is set.

17. The method of claim 16, further comprising:

providing address information from the controller to the memory, wherein the address information specifies the portion of the memory array; and changing the second count value responsive to the address information.

18. The method of claim 16, further comprising incrementing the first count value responsive to performing the access operation on the word line; and incrementing the second count value responsive to performing the access operation on the portion.

19. The method of claim 16, further comprising storing a row address in an aggressor queue responsive to the first count value crossing the first threshold.

20. The method of claim 16, wherein checking the status of the RFM flag includes performing a mode register read (MRR) operation on a mode register of the memory.

21. The method of claim 20, further comprising performing an access operation on another portion of the memory array while performing the MRR operation.

* * * * *